United States Patent
Replogle

(10) Patent No.: US 6,420,877 B1
(45) Date of Patent: Jul. 16, 2002

(54) CONTINUITY TOTALIZER/ANALYZER

(75) Inventor: Gavin L. Replogle, Kendallville, IN (US)

(73) Assignee: Group Dekko Services, LLC, Kendallville, IN (US)

( * ) Notice: Subject to any disclaimer, the term of this patent is extended or adjusted under 35 U.S.C. 154(b) by 0 days.

(21) Appl. No.: 09/291,732

(22) Filed: Apr. 14, 1999

(51) Int. Cl.[7] .............................................. G01R 31/08
(52) U.S. Cl. ...................................................... 324/525
(58) Field of Search ................................ 324/525, 503, 324/415, 423, 538, 519, 66, 527, 522, 523; 363/88, 139, 57, 85, 129, 87; 307/112, 82, 87; 379/26, 27, 32

(56) References Cited

U.S. PATENT DOCUMENTS

| | | | | |
|---|---|---|---|---|
| 4,130,794 A | * | 12/1978 | Cox | 324/51 |
| 5,063,516 A | * | 11/1991 | Jamoua et al. | 364/431.11 |
| 5,117,189 A | * | 5/1992 | Terminiello et al. | 324/415 |
| 5,565,784 A | * | 10/1996 | DeRenne | 324/527 |
| 5,825,850 A | * | 10/1998 | Bren et al. | 379/26 |

* cited by examiner

Primary Examiner—N. Le
Assistant Examiner—Etienne LeRoux
(74) Attorney, Agent, or Firm—Taylor & Aust, P.C.

(57) ABSTRACT

A method and apparatus for detecting and determining discontinuities in a load under test. The apparatus is preferably a digital continuity analyzer that determines, by time duration of a discontinuity signal, discontinuities in a resistive load under test and displays a total count thereof. Circuit characteristics allow for adjustable time periods for determining discontinuities as required by various tests. During the discontinuity determination, the circuit automatically resets when the discontinuity ceases. Total discontinuities are displayed for the length of the test.

26 Claims, 4 Drawing Sheets

CONTINUITY TOTALIZER/ANALYZER

BACKGROUND OF THE INVENTION

1. Field of the Invention

The present invention relates to electronic test equipment used for resistive load testing and, more particularly, to electronic continuity analyzers for resistive load continuity analysis.

2. Description of the Related Art

It is common in many industries to purchase or source parts from various outside vendors. The purchased parts generally must meet various product fabrication and test specifications. These specifications generally become part of the purchase contract/order and thus, the supplier/manufacturer must perform the required tests on the products prior to shipping in order to verify that the products meet the specifications. In many instances equipment has been developed to aid in or totally perform the necessary test(s).

One industry which requires testing of the parts/components it purchases from outside vendors is the U.S. auto industry. What are known as US Car Standards have been developed for the parts/components used by the automotive industry. One type of auto component that requires testing by the purchaser is automotive sockets.

The USCAR/EWCAP PF-1 REV. A standard relates to the testing of lamp sockets, and particularly to the testing of brake light assemblies. In the standard, Section 5.3.4.2 requires that "there shall be no loss of electrical continuity, (>=7 Ohms), for more than 1 microsecond on any terminal pair." Sections 6.4.4, 6.6.1, and 6.6.2 require that the analyzer should be set "to record any change in current through the resistor below 95 mA," while section 6.4.4.2, step 5 specifies a 120 Ohm resistance and a 12 V DC power supply at 100 mA for the external test circuit. The auto industry will only accept components that successfully pass the tests.

Various types of independent tests may be performed on the electrical component by the test device. Such tests may include thermal shock, vibration, and temperature/humidity testing such as that outlined in paragraph 2.5.2 of the Chrysler Engineering Standard PF-752. These tests can last up to many days. One specified humidity test is thirteen (13) days in length, while one thermal shock test is eight (8) days in length.

Test devices have been developed to aid in the testing procedure. One such device for testing continuity or discontinuity in electrical components is the Bally Intermittence Detector Model #879. This device and others are analog circuits that generally only indicate whether a discontinuity has occurred (i.e. "pass/fail") and may also only be used for tests requiring a specific, or internally "hard-wired" time period. For these prior art devices it is cumbersome to manually record the total number of failures as is required for many of the tests.

There is a need for a continuity tester that can perform these functions in a more efficient and/or flexible manner.

SUMMARY OF THE INVENTION

The present invention is a method and apparatus for analyzing the electrical continuity of a sample load.

The present method detects and counts discontinuities occurring in a load under test. An incoming signal is analyzed to determine if a discontinuity occurs. The discontinuity is counted and a total count is displayed.

In one form, a discontinuity in a sample load is determined by coupling the sample load in circuit with a power source and a known resistance to form a test circuit. A test circuit signal representative of a characteristic of the test circuit is compared to a reference signal. If the comparison results in a discontinuity determination, the discontinuity is counted.

In one embodiment, the time duration of the detected discontinuity is determined and compared to a predetermined time duration. The detected discontinuity is counted only if the detected discontinuity reaches the predetermined time duration. The predetermined time duration is preferably adjustable over a range of values. Further, the discontinuity detection is preferably automatically reset after a discontinuity.

The present apparatus detects and counts discontinuities occurring in a load under test. An incoming signal from the load under test is analyzed by the present apparatus to determine if a discontinuity occurs in the load under test. The discontinuity is counted and a total count is displayed.

In one form, the present apparatus is a continuity analyzer having an input stage that receives a test signal from the load under test and feeds an output signal to a discontinuity detection stage. A detected discontinuity is received by a clocking, counter or time duration comparison stage which determines if the detected discontinuity is of sufficient duration to be considered a discontinuity for test purposes. Any discontinuity signal from the clocking stage is received by a counter stage that tallies the clocking stage signal indicating that a discontinuity was detected. Preferably, a display stage provides visual representation of the total count of detected discontinuities.

In one form, the time duration of the detected discontinuity is determined and compared to a predetermined time duration. The detected discontinuity is counted only if the detected discontinuity reaches the predetermined time duration. The predetermined time duration is preferably adjustable over a range of values. Further, the discontinuity detection is preferably automatically reset after a discontinuity.

In another form, the present continuity analyzer accepts a current input from a test circuit having a load or device under test, and a voltage source as circuit elements. The current through the load is quantified by measuring a voltage drop across a portion of an input resistance. The input resistance is a known quantity such as a 120 Ohm ($\Omega$) resistance. A reference voltage is generated and adjusted relative to a standard voltage drop. A discontinuity condition detection means compares the reference voltage to the voltage drop across the input resistance. If the voltage drop across the input resistance drops to within a predetermined value or level relative to the reference voltage, such as to within 0.005V above the reference voltage, a timing sequence of the discontinuity condition detection means commences. This may occur when there is an open circuit, or when the resistance of the load increases by a certain value, such as 7$\Omega$. If the voltage does not increase past the predetermined value after a predetermined time period, such as 1 $\mu$s, a discontinuity condition is met. A count is then registered and displayed by a display means. However, if the voltage does increase past the predetermined value after the predetermined time period, a discontinuity condition has not been met. At this point, the discontinuity condition detection means is automatically reset to begin detecting a discontinuity.

It is an advantage of the present invention that the total number of failures during a test cycle is determined.

It is another advantage of the present invention that there is an automatic circuit reset.

It is further an advantage of the present invention that the circuit can distinguish whether the load under test had a discontinuity time period long enough to be determined a discontinuity for test purposes.

It is still another advantage of the present invention that it can accommodate varying currents and time periods.

It is further yet an advantage of the present invention that it can count greater than 1 discontinuity for test purposes.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE INVENTION

Figure 1:
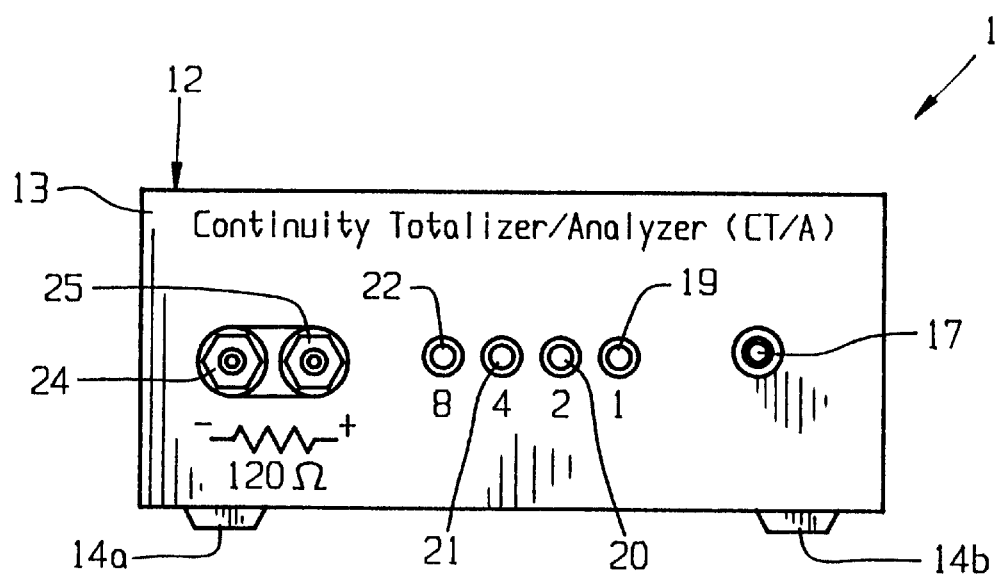
FIG. 1 is front elevation view of an embodiment of the present continuity analyzer.
Figure 2:
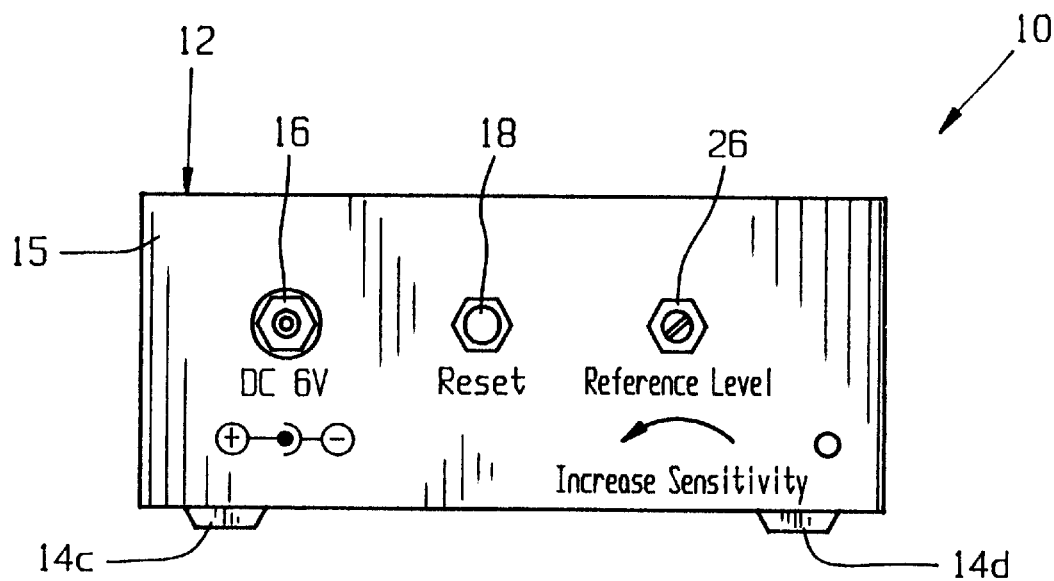
FIG. 2 is a rear elevation view of the continuity analyzer of FIG. 1.

Referring now to the drawings and more particularly to FIGS. 1 and 2 there is shown continuity analyzer 10 being an exemplary embodiment of the present invention as summarized above. Continuity analyzer 10 has housing 12 supported by four (4) feet 14a, 14b, 14c, and 14d, made preferably from a non-abrasive material, such as rubber. Housing 12 supports and retains various components described herebelow that comprise an embodiment of the present invention.

Face 15 of housing 12 supports power input connector/jack 16 of the type that receives a complementary connector/plug (not shown) coupled to an external power source. In the present embodiment, the external power source has been chosen to be six (6) volts DC with the jack polarity indicated on the jack polarity graphic disposed below connector/jack 16. Other voltages via different sources may be utilized, however, some modification of the presently disclosed electrical circuit may be necessary, but evident to one skilled in the art. Since the present embodiment is digital, the power source should be adequate to power ICs implementing the continuity analyzer, and to provide adequate power for any internal voltage regulation. Face 15 also supports reset button 18 disposed adjacent power input connector/jack 16, and reference level potentiometer knob 26 adjacent reset button 18. A "Reset" label is disposed below reset button 18, while a "Reference Level Increase Sensitivity" graphic is disposed below reference level potentiometer knob 26.

Face 13 supports power indicator 17 that may be an LED or the like, four (4) output LEDs 19, 20, 21, and 22, and load/test circuit binding posts 24 and 25. Power indicator 17 provides an indication that external power has been connected as provided through connection of an appropriate power source (not shown) to power input connector/jack 16. Output LEDs 19–22 provide a binary indication or display of the total discontinuity count. LED 19 denotes the binary "1's" column bit, and indicates a binary "1" ("on") as a lit condition and a binary "0" ("off") as a not lit condition. LED 20 denotes the binary "2's" column bit, and indicates a binary "1" ("on") as a lit condition and a binary "0" ("off") as a not lit condition. LED 21 denotes the binary "4's" column bit, and indicates a binary "1" ("on") as a lit condition and a binary "0" ("off") as a not lit condition. LED 22 denotes the binary "8's" column bit, and indicates a binary "1" ("on") as a lit condition and a binary "0" ("off") as a not lit condition. Binding post 24 ("–" polarity) and binding post 25 ("+" polarity) each receives a lead of test circuit 58 (see FIG. 4). As described below, a resistance is internally coupled between binding posts 24 and 25. In the present embodiment, the total resistance is 120Ω (Ohm), as evidenced by the graphic posted below binding posts 24 and 25. Of course, other resistance values may be used with or without modification to the present circuit. Also, it should be understood that the placement of the components on faces 13 and 15, or on other faces of housing 12, is generally arbitrary.

Figure 3A:
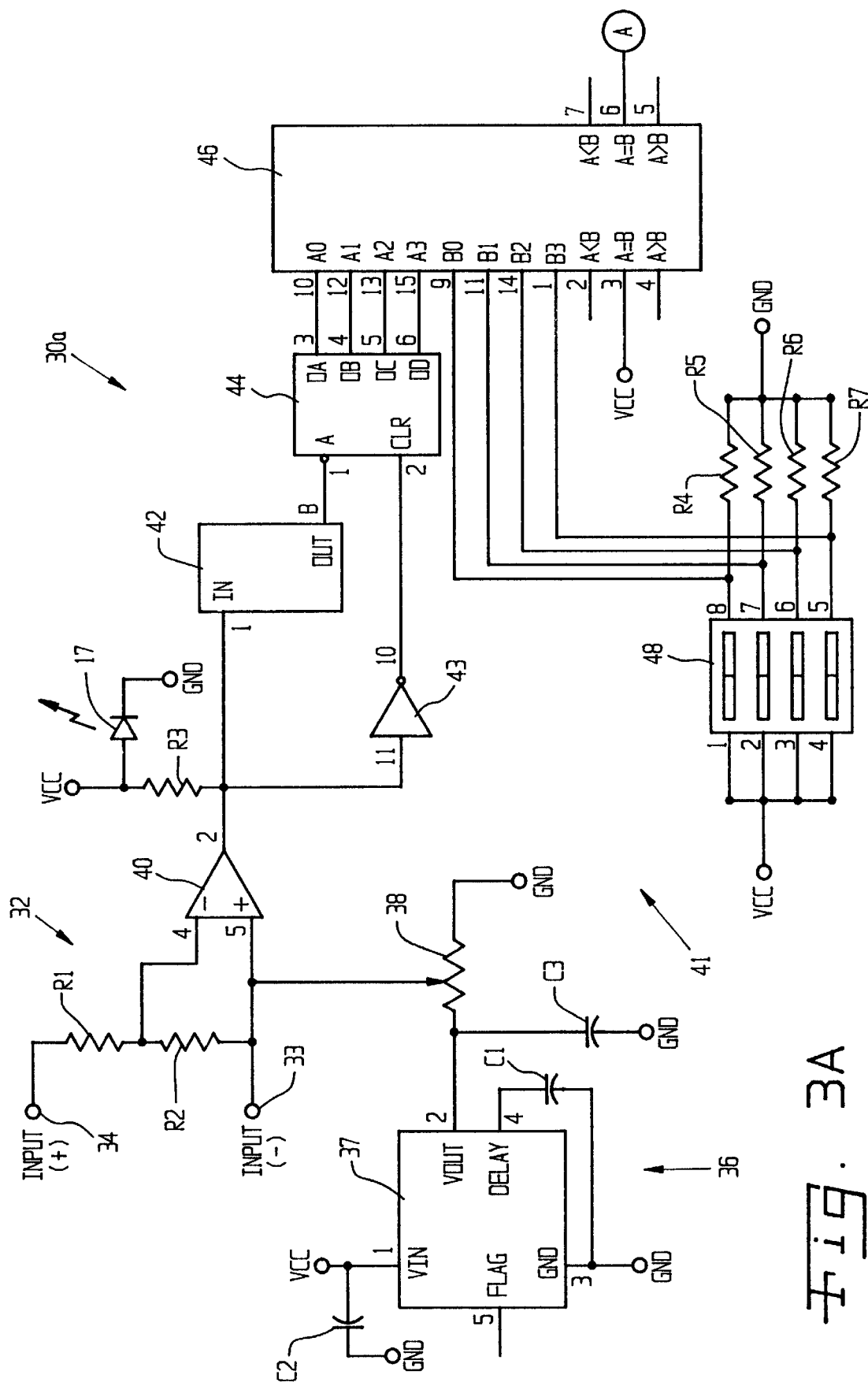
FIG. 3A is a partial electrical diagram of an embodiment of the present continuity analyzer.
Figure 3B:
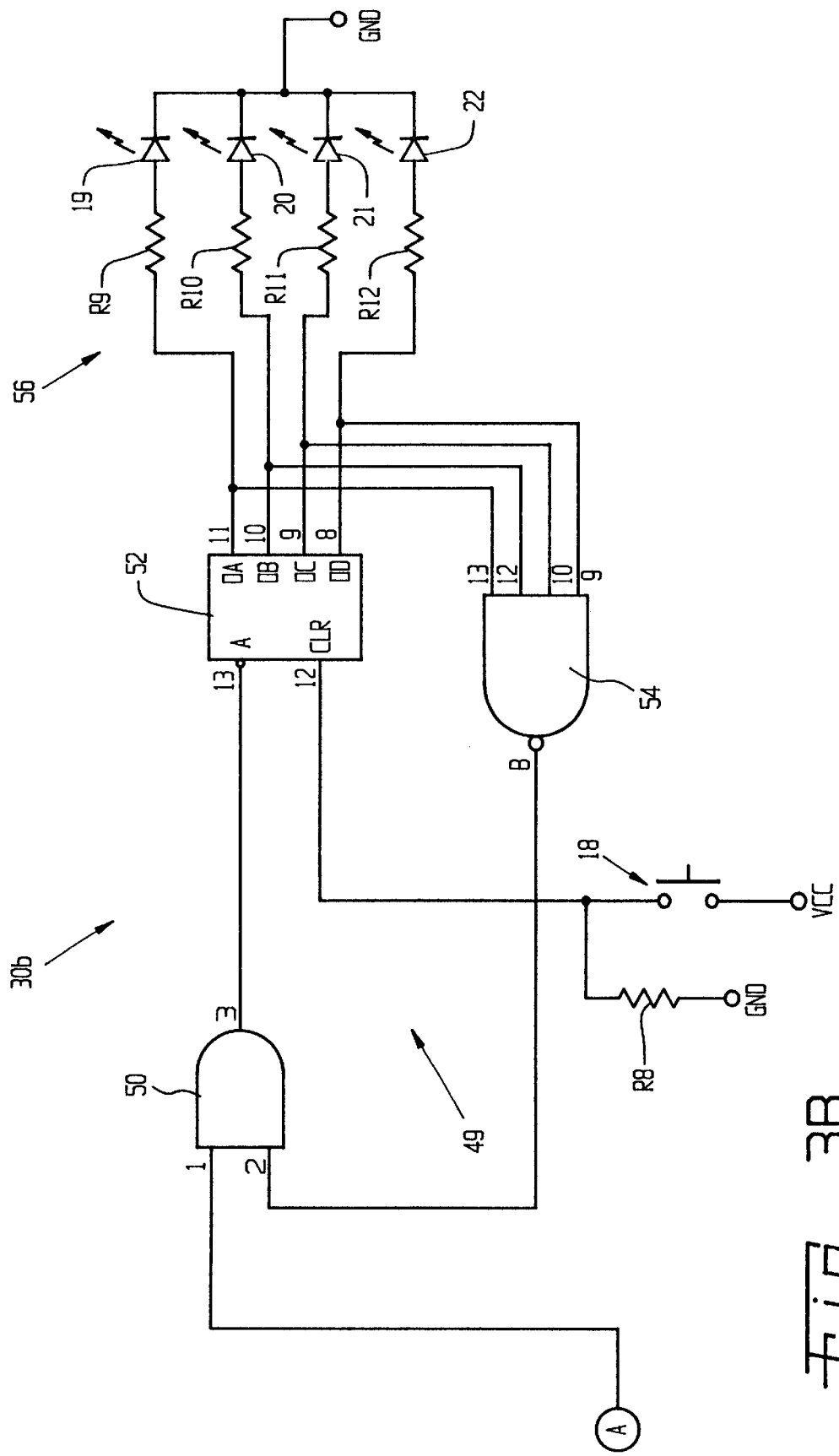
FIG. 3B is a continuation of the electrical diagram of FIG. 3A.

With general reference now to FIGS. 3A and 3B, there is shown continuity analyzer circuit 30. Continuity analyzer circuit 30 includes input section or stage 32 that receives a test circuit signal from test circuit 58 (see FIG. 4). Input section 32 has resistors R1 and R2 coupled in series and forming the above referenced 120Ω internal resistance between binding posts 24 and 25, one of which is approximately 49Ω. Input terminal 33, of "minus" ("–") polarity, is coupled to one end of resistor R2 while input terminal 34, of "positive" ("+") polarity, is coupled to one end of resistor R1, where input terminal 33 corresponds to binding post 24 and input terminal 34 corresponds to binding post 25. The electrical resistive load to be tested is coupled to binding posts 24 and 25 and in circuit with an external power supply.

Figure 4:
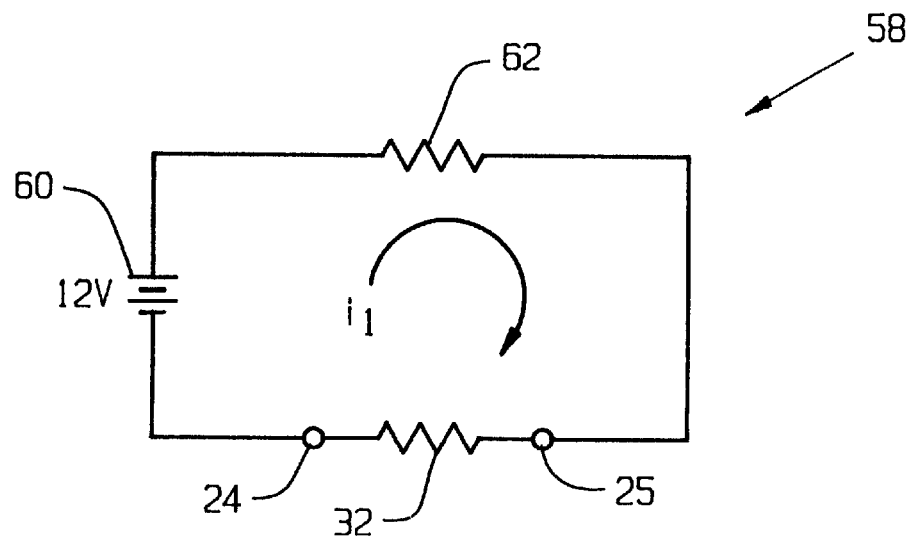
FIG. 4 is a representative electronic diagram of a test circuit with an external load under test that is to be coupled with the present continuity analyzer.

With additional reference to FIG. 4, there is shown test circuit 58 which illustrates the connection of a sample load to be tested by the present continuity analyzer 30. Resistor 62 corresponds to a sample load under test and hereafter, is referred to as sample load 62. Sample load 62 is an electrical resistive load such as a lamp socket, and may be many individual lamp sockets electrically coupled to create a total resistive load 62. The resistance of sample load 62 should be known. Test circuit 58 includes a preferably variable DC power source 60, for providing a voltage at approximately 12 volts. Resistance 32 corresponds to resistors R1 and R2 and is the internal input resistance which is coupled between input terminals 33 and 34 and thus binding posts 24 and 25 respectively. One end of resistance load 62 is coupled to input terminal 34 ("+") via binding post 25 with the other end of load resistance 62 coupled to the positive ("+") side of DC power source 60. The resistance of resistive load 62 is a known quantity from measurement thereof in order to maintain the proper current/voltage ratio within test circuit 58 along with internal resistance 32. A 100 mA current loop, denoted i1, is generated within test circuit 58. However, with a voltage adjustable voltage source 60, the current can be varied. Once voltage source 60 output is set, if the resistance of resistive load 62 changes, such change can be detected by the change in current that results therefrom, i.e. the change in the voltage drop across the input resistance.

Referring back to FIGS. 3A and 3B, continuity circuit 30 also includes voltage regulator section or stage 36 that may be considered as part of discontinuity detector stage 41 and that provides a regulated voltage supply for use in setting a threshold level. Voltage regulator section 36 comprises voltage regulator IC 36, such as an LM2926, configured to provide a five (5) volt DC output at $V_{out}$, pin 2. Coupled to $V_{in}$, pin 1, of voltage regulator IC 37 is capacitor C2, here a 1 μF capacitor, that is coupled to ground GND, and the external power source VCC, which is supplied via power connector/jack 16. Pin 3, GND, is coupled to ground GND and to pin 4, Delay, by capacitor C1, here a 10 nF capacitor. $V_{out}$, pin 2, is coupled to ground GND through capacitor C3, here a 10 μF capacitor, and to one side of potentiometer 38. Another side of potentiometer 38 is coupled to ground GND, while the third lead of potentiometer 38 is coupled to one input, here the "+" input, pin 5, of comparator 40. Potentiometer 38 allows the adjustability of the reference voltage level signal or trigger level signal inputted to comparator 40 via potentiometer 38. Such adjustment is done during calibration and may be necessary to perform various tests. Another input, the "−" input, pin 4, of comparator 40 receives a resistance load characteristic signal or discontinuity signal from test circuit 58 via input resistor 32 which forms part of test circuit 58 and continuity analyzer 30.

It should be understood that test circuit 58 may be either external to continuity analyzer 30 as shown in the various drawings, or can be provided internal or integral with continuity analyzer 30.

Comparator 40, again that may be considered part of discontinuity detector stage 41, compares the inputted signals at Pins 4 and 5, and produces a "high" or logic "1" on output Pin 2 when the test input signal from input stage 32 changes relative to the reference signal by a predetermined amount (i.e. the voltage drop across input resistor 32 drops to within a predetermined value above the reference voltage), else comparator produces a "low" or logic "0" on output pin 2. This may occur during an open circuit condition in test circuit 58, or a resistance increase by sample load 62. Thus any change in resistance of test circuit 58 will cause a change in the test signal and that change is detected by comparator 40.

The output, pin 2, of comparator 40 is coupled directly to the enable input, pin 1, of oscillator 42, again that may be considered part of discontinuity stage 41. Oscillator 42 is preferably a crystal oscillator that is removably mounted in the circuit, such that different time periods may be achievable in conjunction with counter 44, magnitude comparator 46, and DIP switch 48. Because of the time value required for the above-mentioned tests, here centered around 1 μs, oscillator 42 has a frequency of 3.76 MHz. If a discontinuity occurs in the test load, or the resistance changes by more than 7Ω, the test input signal will change in value relative to the voltage regulator input signal. This change is detected by comparator 40 which outputs a "high" or logic "1" signal on pin 2. The "high" signal is received by the enable input of oscillator 42 which activates oscillator 42 to provide an oscillatory output signal at oscillator 42 Out, pin 8. Oscillator 42 is maintained in the "on" state until a "low" or logic "0" signal is received on the enable pin, (pin 1).

During the time that the Enable input, pin 1, of oscillator 42 is maintained "high", oscillator 42 continues to cycle or clock counter 44. The Enable input, pin 1, of oscillator 42 is maintained "high" when the comparator output, pin 2 is "high" which results when there is a change in the electrical characteristics of load circuit 58 indicating a discontinuity in resistive load 62.

As depicted in FIG. 3A, comparator 40 output at pin 2, is also coupled to the input, pin 11, of inverter 43. The output, pin 10, of inverter 43 is coupled to the Clear input CLR, pin 2, of counter 44. The Clear input CLR resets counter 44 when a "high" or logic "1" is received. As long as there is a discontinuity as indicated above, comparator 40 will output a "high" or logic "1" signal which is inverted to a "low" or logic "0" signal by inverter 43 and inputted into the Clear input CLR of counter 44. A "low" or logic "0" is ignored by Clear input CLR. Thus, counter 44 may continue to count based on the output or frequency of oscillator 42. When the discontinuity ceases, comparator 40 outputs a "low" or logic "0" which triggers oscillator 42 to stop outputting pulses of "highs" and "lows" (logic "1s" and "0s") at Output pin 8. Also, the "low" or logic "0" is inverted by inverter 43 which produces a "high" or logic "1" signal which is received at counter 44 Clear CLR input, pin 2, causing counter 44 to reset.

Thus, during use, when a discontinuity exists in the test load 62 (see FIG. 4) the length of time of the discontinuity is measured by discontinuity determination/timing stage 41 via counter 44, oscillator 42, DIP switch 48 and magnitude comparator 46. This is determined by the frequency of oscillator 42 as the input clock or signal to counter 44. When the discontinuity ceases, counter 44 ceases clocking. To determine whether the measured time period of the discontinuity reaches a certain threshold, or lasts for a sufficient period of time, to be considered a test discontinuity failure, the 4-bit output of counter 44 as it is clocked is compared to a selected 4-bit value representing a predetermined count or number that corresponds to a time period, here around 1 μs. The selected 4-bit value is set via DIP switch 48. Counter 44 has 4-bit binary outputs OA, OB, OC, and OD which are coupled to first inputs A0, A1, A2, and A3 of 4-bit magnitude comparator 46, such as a 74LS85 4-bit magnitude comparator. DIP switch 48 is a four (4) position switch in which each switch is coupled at one end to VCC and the other end to GND through resistors R4, R5, R6, and R7. Each switch is coupled to second inputs B0, B1, B3, and B4 of 4-bit magnitude comparator 46, such that the 4-bit counter output is compared to the selected 4-bit value from DIP switch 48. When the 4-bit counter value reaches the same value as the predetermined count, output A=B of 4-bit magnitude comparator 46 provides a "high" or logic "1" signal, else a "low" or logic "0" signal is maintained. If the discontinuity signal lasts longer than the predetermined threshold time, counter 52 continues to count periods of predetermined threshold times.

Referring specifically to FIG. 3B, magnitude comparator 46 is coupled to counter stage 49 including AND gate 50, counter 52, NAND gate 54, and reset 18. Specifically, the A=B output, pin 6, of magnitude comparator 46 is coupled to one input, pin 1, of two-input AND gate 50. The output of AND gate 50 is coupled to the input of counter 52, a 4-bit counter such as a 74HC393. Counter 52 accumulates or totals the number of discontinuities or test part failures for display to the user as such discontinuities are detected and passed by discontinuity determination stage 41. The other input, pin 2, of two-input AND gate 50 receives the output, pin 8, of quad-input (4-bit input) NAND gate 54 whose four input lines, pins 9, 10, 12, and 13, receives the 4-bit output of counter 52 from output lines OA, OB, OC, and OD, respectively. NAND gate 52 will thus always output a "high" or logic "1" signal unless a binary fifteen (15)(1111) is reached by counter 52, in which case a "low" or logic "0" signal is outputted, latching AND gate 50 such that it will not output a "high" or logic "1" signal. This effectively stops counter 52 at a count of fifteen (15) discontinuities.

As 4-bit magnitude comparator 46 outputs a "high" signal on the A=B line, AND gate 50 receives the "high" signal on input, pin 1. As long as a count of fifteen (15) is not reached by counter 52, NAND gate 54 outputs a "high" or logic "1" and thus AND gate 50 will output a "high" or logic "1" signal to counter 52 which increments counter 52. If a count of fifteen has been reached by counter 52, NAND gate 54 will produce a "low" or logic "0" signal that is received on input, pin 2, of AND gate 50. In this case, since input, pin 2, of AND gate 50 is "low", the input, pin 1, of AND gate 50 does not matter, since AND gate 50 will then always output a "low" or logic "0" signal to counter 52, in which case there will be no increment.

Reset 18, which is normally open, is coupled to VCC and ground GND via resistor R8, and to the Clear CLR input, pin 12, of counter 52 such that a normally "low" or logic "0" signal is applied to the Clear CLR input of counter 52. When reset 18 is closed, a "high" or logic "1" signal is presented to Clear CLR input, pin 12, by connection to VCC causing counter 52 to reset to zero (0).

Continuity circuit 30 further includes an output or display section or stage 56 for indicating or displaying the total number or count of discontinuities. In the particular embodiment shown in FIG. 3B, each output line OA, OB, OC, and OD, of counter 52 is coupled to a respective resistor R9, R10, R11, and R12, which are in turn coupled to a respective LED 19, 20, 21, 22. LED 19 corresponds to the "1s" component of the binary system, LED 20 corresponds to the "2's" component of the binary system, LED 21 corresponds to the "4's" component of the binary system, and LED 22 corresponds to the "8's" component of the binary system, thereby providing an output count in binary form. Thus, an "on state" of a particular LED indicates a "1" digit for that particular binary component.

Figure 5:
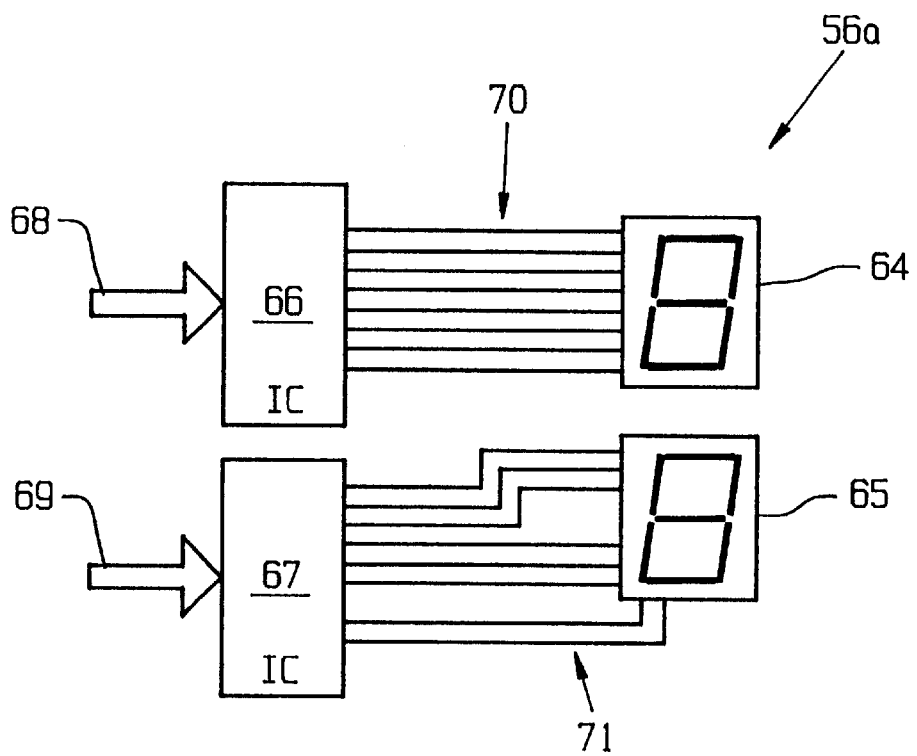
FIG. 5 is an electrical diagram of an alternative embodiment of the output or display section of the embodiment of FIG. 4.

With reference now to FIG. 5, there is shown alternative output/display circuit 56a, one of many types of display configurations that may be used. Output/display circuit 56a shows the total failure count determined by the present invention via first 7-segment LED 64 and second 7-segment LED 65. Appropriate counter output 68 is fed into first decoder and driver IC 66 while other appropriate counter output 69 is fed into second decoder and driver IC 67. Both first and second decoder and driver ICs 66 and 67 accept counter input 68 and 69 respectively, process, and then output appropriate signals along lines 70, in the case of 7-segment LED 64 and IC 66, and along lines 71, in the case of 7-segment LED 65 and IC 67 to drive LEDs 64 and 65. It should be appreciated from the foregoing, that many types of output displays may be used.

Additionally, power LED 17 is coupled to VCC and ground GND and to the comparator output, pin 2, via resistor R3, having a value of 3KΩ. When external power is applied via connector/jack 16 LED 17 is illuminated.

A method of operation of continuity analyzer 10 will now be described. Initially, the lead wires from the sample(s) under test and the power supply are attached to binding posts 24 and 25, being mindful of polarity. Using a preferably calibrated ammeter, adjust power supply 60 voltage of test circuit 58 so that 95 mA DC is obtained. Press reset 18 and observe the state of LEDS 19, 20, 21, and 22. If LEDs 19–22 are ON, potentiometer 38 via knob 26 is adjusted for a decrease of sensitivity, until all LEDs 19–22 are OFF. If LEDs 19–22 are OFF, potentiometer 38 via knob 26 is adjusted for an increase of sensitivity, until all LEDs 19–22 are ON. After adjustment, reset 18 is activated. The above procedure is repeated until such adjustments have been reduced to fractions of a turn. This sets the internal current from regulator stage 36 to approximately 95 mA for an accurate comparison by comparator 40. A final adjustment makes sure that all LEDs 19–22 are OFF. Thereafter, power supply 60 is adjusted for 100 mA and the test begins. The number of discontinuities is displayed up to a count of 15. The sample(s) under test may remain coupled to the present continuity analyzer 10 for any period of time. Reset 18 may be pressed at any time to clear counter 52 and start any test again.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method of determining at least one electrical discontinuity in a test load, said method comprising the steps of:
   placing the test load in a series circuit with a voltage source and an input resistance, said test load, said voltage source and said input resistance being connected in series;
   generating a load characteristic signal across at least a portion of said input resistance, said load characteristic signal being dependent upon an impedance of said test load;
   determining whether a change in said load characteristic signal is indicative of a discontinuity condition, said determining step including the substeps of:
      generating a reference voltage signal;
      comparing said load characteristic signal to said reference voltage signal and generating a preliminary discontinuity voltage signal when said load characteristic signal reaches a predetermined threshold voltage value relative to said reference voltage signal; and
      comparing a time duration of said preliminary discontinuity voltage signal to a predetermined time duration; and
   generating a discontinuity signal when said preliminary discontinuity voltage signal reaches said predetermined time duration.

2. The method of claim 1, further comprising the steps of:
   monitoring said load characteristic signal for further changes;
   for each said further change, repeating said determining step and said step of generating a discontinuity signal;
   tallying a total number of said discontinuity signals; and
   displaying said total number of said discontinuity signals.

3. The method according to claim 1, wherein said step of generating a load characteristic signal includes placing the test load in circuit with an input resistance.

4. The method according to claim 3, where said input resistance includes two resistors in series, and said load signal comprises a voltage measured across one of said two resistors.

5. The method according to claim 1, wherein said predetermined time duration is 1 µs.

6. The method according to claim 1, wherein said predetermined time duration is variably settable.

7. The method according to claim 1, wherein said load characteristic signal is measured in volts, and said predetermined threshold value is a value within 0.005 volts of said reference voltage signal.

8. The method according to claim 1, further comprising generating a reset signal if a discontinuity condition is not met before generating a discontinuity signal when said load characteristic signal is determined to be indicative of a discontinuity condition.

9. An apparatus for counting a plurality of electrical discontinuities that occur in a test load over a period of time, the apparatus comprising:
   an input stage circuit configured to be connected in series with the test load and a voltage source, said input stage circuit being configured to receive a test load voltage signal indicative of each of the electrical discontinuities;
   a discontinuity detector stage circuit including:
      a reference signal generator outputting a reference signal;
      a timing circuit;
      a comparator having an output, one input coupled to said reference signal generator and another input coupled to said input stage circuit to monitor said test load voltage signal, said comparator providing a respective one of a plurality of discontinuity output signals upon each occurrence of said test load voltage signal reaching a predetermined value relative to said reference signal; and
      a timing circuit coupled to said output of said comparator, said timing circuit receiving said discontinuity output signals and outputting a respective one of a plurality of timing circuit signals for each said discontinuity output signal having a duration reaching a predetermined time period; and
      a counter stage circuit coupled to said timing circuit and configured to receive and count said timing circuit signals.

10. The apparatus of claim 9, further comprising:
a display stage circuit coupled to said counter stage circuit and configured to display a total of said timing circuit signals counted by said counter stage circuit.

11. The apparatus of claim 9, wherein the discontinuity detector stage circuit provides a reset signal for the discontinuity detector stage circuit to clear and resume monitoring for discontinuities in said test load signal.

12. The apparatus of claim 9, wherein said predetermined time period is adjustably settable.

13. The apparatus of claim 12, wherein said predetermined time period is adjustable via a DIP switch.

14. The apparatus of claim 9, wherein said timing circuit includes:
   an oscillator configured to receive said discontinuity output signals and provide an oscillator signal upon receipt of said discontinuity output signals;
   a counter coupled to said oscillator and configured to count oscillations of said oscillator signal and output a count signal; and
   a magnitude comparator configured to receive said count signal and a predetermined count value, said magnitude comparator providing said timing circuit signals.

15. The apparatus of claims 14, further comprising a DIP switch coupled to said magnitude comparator for setting said predetermined count value.

16. The apparatus of claim 9, wherein said reference signal generator is adjustable to set said reference signal.

17. A continuity analyzer for determining discontinuities in a resistive test load, the continuity analyzer comprising:
   an input circuit having a known resistance and configured to be connected in series with a test load and a voltage source, said input circuit being configured to receive an input signal from said test load circuit, said test load circuit containing the resistive test load, said input signal being indicative of a characteristic of said test load;
   a threshold determination circuit coupled to said input circuit to receive said input signal, said threshold determination circuit generating a reference signal and configured to generate a first discontinuity signal when a difference between said input signal and said reference signal is within a predetermined range;
   a timing circuit coupled to said threshold determination circuit to receive any said first discontinuity signal and provide a second discontinuity signal upon a period of duration of said first discontinuity condition signal reaching a predetermined time duration; and
   a counter circuit coupled to said timing circuit to receive said second discontinuity signals and provide a total discontinuity signal count.

18. The continuity analyzer of claim 17, further comprising:
   a display circuit coupled to said timing circuit to receive and display said total discontinuity signal count.

19. The continuity analyzer of claim 17, wherein said input signal threshold determination circuit is coupled to said input circuit at said resistive load to measure a voltage drop in said input signal.

20. The continuity analyzer of claim 17, wherein said threshold determination circuit includes a comparator coupled to receive said reference signal and configured to generate said discontinuity condition signal.

21. The continuity analyzer of claim 20, wherein said timing circuit includes an oscillator that is coupled to said comparator to receive said reference signal and provide an oscillating signal in response, a counter coupled to said oscillator to receive said oscillating signal and to provide an oscillator count signal, and a magnitude comparator coupled to said counter to receive said oscillator count signal, said magnitude comparator receiving a predetermined threshold count signal and generating a discontinuity count signal when said oscillator count signal equals said predetermined threshold count signal.

22. The continuity analyzer of claim 21, wherein said predetermined threshold is variably settable.

23. The continuity analyzer of claim 22, further comprising a DIP switch coupled to said magnitude comparator that provides said variably settable predetermined threshold.

24. The continuity analyzer of claim 17, wherein said counter circuit includes a first reset circuit to set said total discontinuity signal count to zero.

25. The continuity analyzer of claim 24, wherein said first reset circuit includes a manual reset switch.

26. The continuity analyzer of claim 17, further comprising a second reset circuit that automatically resets said timing circuit after a discontinuity condition signal is produced.

* * * * *